United States Patent [19]

Ritland et al.

[11] Patent Number: 5,503,122

[45] Date of Patent: Apr. 2, 1996

[54] ENGINE COMPONENTS INCLUDING CERAMIC-METAL COMPOSITES

[75] Inventors: Marcus A. Ritland, Golden; Dennis W. Readey, Lakewood; Jack D. Sibold, Golden; Dean A. Rulis, Littleton; Richard N. Kleiner, Englewood, all of Colo.

[73] Assignee: Golden Technologies Company, Golden, Colo.

[21] Appl. No.: 220,557

[22] Filed: Mar. 31, 1994

Related U.S. Application Data

[63] Continuation-in-part of PCT/US93/08835, Sep. 17, 1993, and a continuation-in-part of Ser. No. 946,972, Sep. 17, 1992, abandoned.

[51] Int. Cl.$^6$ ............................................. F01L 3/02
[52] U.S. Cl. ............................... 123/188.3; 29/888.45
[58] Field of Search ........................... 123/188.2, 188.3; 29/888.45

[56] References Cited

U.S. PATENT DOCUMENTS

| | | | |
|---|---|---|---|
| 2,612,443 | 9/1952 | Goetzel et al. | 428/539.5 |
| 3,310,427 | 3/1967 | Cheney et al. | 164/98 |
| 3,864,154 | 2/1975 | Gazza et al. | 29/123 B |
| 3,868,267 | 2/1975 | Gazza et al. | 117/22 |
| 3,928,662 | 12/1975 | Kaneko et al. | 427/294 |
| 3,949,804 | 4/1976 | Kaneko et al. | 164/62 |
| 4,359,022 | 11/1982 | Nakamura et al. | 123/188.3 |
| 4,398,527 | 8/1983 | Rynbrandt | 123/188.3 |
| 4,404,262 | 9/1983 | Watmough | 428/539.5 |
| 4,556,022 | 12/1985 | Yamada et al. | 123/188.3 |
| 4,728,374 | 3/1988 | Larson et al. | 123/188.3 |
| 4,739,738 | 4/1988 | Sander et al. | 123/193 |
| 4,824,622 | 4/1989 | Kennedy et al. | 264/59 |
| 4,828,008 | 5/1989 | White et al. | 164/66.1 |
| 4,849,266 | 7/1989 | Dwivedi et al. | 428/34.4 |
| 4,853,352 | 8/1989 | Newkirk et al. | 501/88 |
| 4,867,116 | 9/1989 | de Freitas Couto Rosa et al. | 123/188.3 |
| 4,868,143 | 9/1989 | Newkirk et al. | 501/127 |
| 4,882,306 | 11/1989 | Kennedy et al. | 501/87 |
| 4,988,645 | 1/1991 | Holt et al. | 501/91 |
| 5,000,246 | 3/1991 | Dwivedi et al. | 164/97 |
| 5,004,035 | 4/1991 | Burke et al. | 164/97 |
| 5,005,631 | 4/1991 | Dwivedi | 164/97 |
| 5,007,475 | 4/1991 | Kennedy et al. | 164/97 |
| 5,016,703 | 5/1991 | Aghajanian et al. | 164/97 |
| 5,017,533 | 5/1991 | Newkirk et al. | 501/127 |
| 5,099,808 | 3/1992 | Matsuura et al. | 123/188.3 |
| 5,164,347 | 11/1992 | Kennedy et al. | 501/127 |
| 5,266,537 | 11/1993 | Kennedy et al. | 501/127 |
| 5,267,601 | 12/1993 | Dwivedi | 164/97 |
| 5,295,461 | 3/1994 | Rao et al. | 123/188.3 |

OTHER PUBLICATIONS

"Performance Characteristics Of Metal-Ceramic Composites Made By The Squeeze Casting Process", Suresh K. Verma and John L. Dorcic, IIT Research Institute, Chicago, Ceram. Eng. Sci. Proc., 9[7-8] pp. 579-596 (1988).

"Modeling of Infiltration Kinetics For Liquid Metal Processing of Composites", G. P. Martins, D. L. Olson, and G. R. Edwards, Metallurgical Transactions B, vol. 19B, Feb. 1988, pp. 95-101.

*Primary Examiner*—Henry C. Yuen
*Assistant Examiner*—Erick Solis
*Attorney, Agent, or Firm*—Sheridan Ross & McIntosh

[57] ABSTRACT

Ceramic-metal composites are used in the fabrication of components for engines, particularly internal combustion engines. The composites are formed by infiltrating a molten metal into a porous ceramic matrix and cooling the metal to form a composite. Numerous engine components can be fabricated using this technique including valves, valve seats, exhaust port liners, pistons and rocker arms.

8 Claims, 3 Drawing Sheets

FIG. 6

ENGINE COMPONENTS INCLUDING CERAMIC-METAL COMPOSITES

This application is a continuation-in-part of Patent Cooperation Treaty Application No. PCT/US93/08835, which designates the United States as a continuation-in-part application, and was filed Sep. 17, 1993, which is a continuation-in-part of U.S. patent application Ser. No. 07/946,972, filed Sep. 17, 1992, now abandoned.

BACKGROUND OF THE INVENTION

1. Field of the Invention

The present invention relates to ceramic-metal composite materials, or cermets, and methods of producing such composites. More particularly, the invention relates to engine components comprising ceramic-metal composites fabricated by infiltrating a metal into a porous ceramic matrix.

2. Description of Related Art

During the last few decades, ceramics have been investigated for use in many structural applications, particularly in high temperature environments. However, ceramic materials are not always well suited since they are brittle, have a limited ductility and low values of fracture toughness at low temperatures. In addition, the fracture strength of ceramics is not very reproducible since the average strength usually varies from one lot of parts to the next, which is attributed to the presence of processing flaws which can initiate fractures. A great deal of effort has been expended in an attempt to increase the fracture reliability of ceramic materials and to develop tough and creep-resistant ceramic composites.

One possible solution is the fabrication of a ceramic-metal composite, also commonly referred to as a cermet. Traditionally, ceramic-metal composites have been produced in one of two ways; (1) by heating mixtures of ceramic and metal materials to obtain a metal matrix having a discrete ceramic phase, or (2) as disclosed in U.S. Pat. No. 2,612,443 by Goetzel at al., issued Sep. 30, 1952, by forming a sintered porous body that can be a metal, metal-carbide or metal-nitride, and infiltrating the porous body with a molten metal by the use of mechanical squeeze-casting or other means of applying pressure to force the molten metal into the voids within the porous body.

Other approaches for forming cermets have been used due to a lack of success in obtaining adequate control of cermet composition and form with traditional processes. For example, use of accelerated oxidation reactions and "combustion wave" exothermic reaction processes have been utilized to form cermets. See U.S. Pat. No. 4,988,645 by Holt et al., issued Jan. 29, 1991. The LANXIDE process, such as that disclosed in U.S. Pat. No. 4,853,352 by Newkirk et al., issued Aug. 1, 1989, discloses a method for forming cermets whereby a molten parent metal is oxidized, usually in the presence of oxidation enhancing dopants, to create a three-dimensional interconnected ceramic-metal composite material which contains between 1% and 40% of the parent metal by volume. This process is limited in that only the parent metal is infiltrated into the oxide reaction product and the process takes extended periods of time, such as 48 hours or more.

Infiltration of molten metals into porous ceramic preforms by squeeze casting and by applying pressure to the molten metal are known, for example, see Verma and Dorcic, "Performance Characteristics of Metal-Ceramic Composites Made by the Squeeze Casting Process", *Ceramic Engineering Science Proc.*, Vol. 9, pp. 579–596 (1988). However, it is difficult to achieve near complete infiltration of the void space within the preforms without use of substantial pressure. In addition, when ceramic preform materials contain a high volume porosity, use of pressure in squeeze casting techniques can crumble the ceramic structure. The use of pressure can also preclude the formation of metal-matrix composites having complex shapes. Further, these processes require complex pressure dies and frequently require extensive flash removal, that is, removal of excess metal.

Infiltration using vacuum furnaces and using infiltration enhancers are also described in the art. U.S. Pat. No. 3,864,154 by Gazza et al., issued Feb. 4, 1975, discloses a method for the infiltration of aluminum or silicon into a cold-pressed compact of boron-containing ceramics (e.g., aluminum boride or silicon boride) in a vacuum furnace. It is disclosed that the infiltration process takes about 2 hours.

U.S. Pat. No. 4,828,008 by White et al. issued on May 9, 1989. White et al. disclose a method for infiltrating aluminum alloys into a permeable mass of loose ceramic powder, such as alumina. A nitrogen gas atmosphere must be used and magnesium must be alloyed into the aluminum metal to achieve spontaneous infiltration. U.S. Pat. No. 5,016,703 by Aghajanian et al. and issued on May 21, 1991, discloses a process for the spontaneous infiltration of aluminum into a ceramic preform that comprises a mass of particles, platelets, whiskers or fibers. An infiltration enhancer, such as magnesium turnings, is placed between the molten metal and the preform to enhance the infiltration. The infiltration time is on the order of about 5 hours.

U.S. Pat. No. 5,004,035 by Burke et al. issued Apr. 2, 1991, discloses the use of infiltration enhancers for infiltrating aluminum alloys into alumina or silicon carbide preforms that comprise loose particles of materials such as alumina or silicon carbide. After infiltration, which can take on the order of about 10 hours, the metal composite can be reheated and worked to vary the properties of the composite.

U.S. Pat. No. 5,017,533 by Newkirk et al. issued on May 21, 1991. Newkirk et al. is directed to a method for producing a self-supporting ceramic body by oxidation of a molten precursor metal with a vapor-phase oxidant to form an oxidation reaction product. A second metal is incorporated into the molten flux during the oxidation reaction. For example, copper can be alloyed into aluminum which is then oxidized to form an alumina oxidation product. The oxidation process takes on the order of 48 hours or more.

U.S. Pat. No. 5,007,475 by Kennedy et al. issued on Apr. 16, 1991. Kennedy et al. disclose the formation of a metal matrix composite body by the spontaneous infiltration of a molten matrix metal into a three-dimensionally interconnected material. The metal is an aluminum alloy and the three-dimensional matrix is preferably alumina. The aluminum alloy is placed in contact with the three-dimensional interconnected material and placed in a boat which is then heated to infiltrate the metal into the three-dimensionally interconnected material. The typical infiltration time is on the order of about 7 hours or more.

U.S. Pat. No. 4,868,143 by Newkirk et al., issued on Sep. 19, 1989, discloses a process for making a composite wherein an oxidation reaction product (e.g., alumina) is formed with aluminum parent-metal interconnected therethrough. The composite is then contacted with a second molten metal, such as copper or nickel, which infiltrates the interconnected parent metal by interdiffusion. The result is a composite having a mixture of two metals interconnected throughout the composite.

The use of ceramic-metal composites for certain engine components has been suggested in the prior art. For example, U.S. Pat. No. 4,739,738 by Sander et al., issued on Apr. 26, 1988. Sander et al. disclose light alloy components for internal combustion engines, such as a piston, wherein non-woven ceramic fibers are embedded in stressed surface portions of the alloy.

U.S. Pat. No. 4,404,262 by Watmough, issued on Sep. 13, 1983. Watmough discloses a composite metallic and refractory article in which a metallic layer is partially absorbed within a refractory layer, such a ceramic layer. The density of the refractory ceramic layer increases as it extends away from the metallic layer. It is disclosed that the composite is formed by forcing a molten metal under pressure into the porous structure of the refractory layer. The patent discloses that the process is particularly useful for fabricating pistons for internal combustion engines.

There exists a need for a simple and inexpensive process to form ceramic-metal composites, particularly for use as engine components. There are a number of engine components that would benefit from the use of a ceramic-metal composite or a combination of ceramic, metal and ceramic-metal composite. It would be particularly advantageous if such composites could be formed using a process that is quick and produces substantially dense and non-porous composites that include substantially continuous metal and ceramic phases.

SUMMARY OF THE INVENTION

The present invention generally relates to engine components that are fabricated using ceramic-metal composites formed by the infiltration of molten metal into a porous ceramic matrix.

According to one aspect of the present invention, a valve for an internal combustion engine is provided. The valve can include a valve stem having an elongated metallic member and a valve head integrally connected to an end of the valve stem generally having a frustoconical shape and a valve face on the outer circumferential surface of the valve head, wherein the valve head has an upper portion including a valve face and consisting essentially of dense ceramic and a lower portion having a base diameter that is smaller than the upper portion, that includes a metal-infiltrated ceramic.

According to certain embodiments of this aspect of the invention, the valve stem can advantageously include a metal selected from the group of nickel alloys and steel compositions. The valve stem can be welded to the valve head. The valve head can consist essentially of silicon nitride ceramic having a substantially continuous porosity gradient that has been infiltrated with a metal.

According to another aspect of the present invention, a method for making a valve for an internal combustion engine is provided. The method can include the steps of forming a sintered ceramic body generally having frustoconical shape with an upper portion and a lower portion wherein the open porosity of the sintered ceramic in the lower portion is greater than the open porosity in the upper portion, contacting the sintered ceramic body with a molten metal under conditions such that the molten metal infiltrates the open porosity of the sintered ceramic to form a valve head and connecting the valve head to an end of a metal valve stem to form a valve.

According to certain embodiments of this invention, the top surface of the upper portion of the valve head can consist essentially of ceramic. The top surface of the top portion can consist essentially of ceramic that is substantially fully dense. The step of connecting the valve head to the valve stem can include welding the valve head to the valve stem.

According to another aspect of the present invention, a valve seat for an internal combustion engine is provided. The valve seat can include an upper portion that is adapted to receive a valve face wherein the upper portion consists essentially of a metal-infiltrated ceramic, a lower portion integrally connected to the upper portion, the lower portion being adapted to be placed into a cylinder block and consisting essentially of a metal and an aperture extending through the valve seat adapted to receive a valve stem therethrough.

According to certain embodiments of this aspect of the present invention, the metal can include copper metal. The ceramic can preferably be selected from alumina and silicon nitride.

According to another aspect of the present invention, a method for making a valve seat for an internal combustion engine is provided. The method can include the steps of forming a ceramic matrix having interconnected open porosity and contacting the ceramic with molten metal capable of infiltrating the open porosity to form a ceramic-metal composite, wherein an excess of molten metal forms a lower portion of the valve seat that consists essentially of metal.

According to certain embodiments of this invention, the metal can be copper metal or nickel alloys. The ceramic can be selected from the group consisting of alumina and silicon nitride.

According to another aspect of the present invention, a heat insulating exhaust port liner for an internal combustion engine is provided. The liner can include a ceramic liner comprising an aluminum titanate ceramic, a porous ceramic compliant layer substantially enclosing an outer periphery of the ceramic liner and a ceramic-metal matrix substantially enclosing an outer periphery of the compliant layer, the ceramic-metal matrix formed by infiltration of a molten metal into a portion of the porous compliant layer.

According to certain embodiments of this invention, the metal can include a metal selected from the group consisting of copper and nickel alloys. The porous compliant layer can also include a closed foam.

According to another aspect of the present invention, a method for making a heat insulating exhaust port liner for an internal combustion engine is provided. The method can include the steps of casting an aluminum titanate ceramic body having an outer periphery and an inlet and an outlet wherein the inlet is fluidly connected to the outlet, applying a porous compliant layer to the outer periphery of the ceramic body and contacting the porous compliant layer with a molten metal to infiltrate the metal into at least a portion of the compliant layer.

DESCRIPTION OF PREFERRED EMBODIMENTS

The present invention is generally directed to a method for making engine components that include a ceramic-metal composite material with interconnecting and substantially continuous ceramic and metal phases. The composite is formed by infiltrating molten metal into a porous ceramic body having a substantially interconnected and continuous pore structure, referred to as open porosity. The infiltration is preferably accomplished in the absence of significant overpressure and the ceramic is infiltrated by capillary action. Substantially all of the open porosity in the ceramic can be infiltrated, if desired.

According to the present invention, the ceramic matrix material is selected to be compatible with the infiltrant metal. That is, it is preferred that the ceramic matrix is capable of being wetted and infiltrated by the molten metal without the use of any substantial overpressure. It is more preferred that, at the temperature of infiltration, the ceramic matrix is wet by the molten metal. Complete wetting of the ceramic matrix by the molten metal will enhance the spontaneous infiltration of the metal into the ceramic matrix without the use of substantial overpressure to force the metal into the ceramic matrix.

The ceramic matrix is a sintered matrix that comprises a substantially continuous ceramic phase. Among the preferred ceramic matrix materials are the sintered ceramic oxides, carbides and nitrides. In one preferred embodiment, a sintered oxide ceramic is selected from the group of alumina ($Al_2O_3$), aluminum titanate ($Al_2TiO_5$), nickel oxide (NiO), or magnesium oxide (MgO) ceramic. In addition to the primary ceramic oxide, the sintered ceramic can include other materials, such as sintering aids (e.g., $SiO_2$). Sintered aluminum titanate, for example, can also include additives, such as $SiO_2$ or $Fe_2O_3$, which can be added to aluminum titanate as stabilizers. In addition to the above-described oxides, non-oxide ceramics such as silicon carbide (SiC) or silicon nitride ($Si_3N_4$) can be used in some applications. For example, silicon nitride may be particularly useful for certain engine components such as valves or valve seats.

The ceramic matrix is a sintered matrix that has a substantially continuous ceramic phase. The sintered ceramic preferably has an identifiable shape and a free-standing form in the absence of constraining supports. This is to be distinguished from a vessel filled with loose or lightly packed particles or fibers of material. One of the advantages of using a cohesive sintered ceramic matrix is that the cohesive sintered ceramic matrix can be prefabricated into the shape of a selected article of manufacture (a preform). Further, the cohesive sintered ceramic matrix can be gripped by one portion (e.g., a top portion) while another portion of the matrix (e.g., a bottom portion) is contacted with the molten metal. The molten metal will then infiltrate by capillary action into substantially all of the open porosity of the ceramic, including those portions not immersed in the molten metal.

The ceramic matrix material is a sintered, coherent body that has an open and substantially continuous pore structure to facilitate the infiltration of molten metal into the matrix without the use of any substantial overpressure to force the metal into the matrix. As used herein, the term "substantial overpressure" refers to pressure in excess of about 3 atmospheres (about 45 psi) applied during the infiltration process, either mechanically or through the use of pressurized gas.

The total open porosity in the ceramic matrix must be at least about 5 volume percent, and is preferably from about 10 volume percent to about 90 volume percent. More preferably, the open porosity is from about 15 volume percent to about 80 volume percent of the sintered ceramic matrix. The average pore size of the open porosity is preferably from about 1 micrometer to about 10 micrometers, however, it is not believed that the average pore size is critical to the practice of the present invention. Porous ceramics having open and continuous porosity as described above can be formed in a number of ways.

For example, a green body comprising a ceramic powder can be formed and sintered in an enhanced vapor phase sintering process to form a porous body having a substantially continuous and interconnected pore structure. The total porosity and average pore size of the sintered ceramic matrix can be controlled by controlling the porosity of the green body and the sintering conditions. Vapor phase sintering is a convenient process to produce porous ceramics having controlled porosities and pore sizes. As such, the porous ceramics form suitable matrices for infiltration with molten metals to produce ceramic-metal composites having interpenetrating three-dimensional structures.

In the vapor phase sintering process, a green body is formed from ceramic powder. The starting particle size is not critical to the practice of the present invention, however, a smaller average particle size can be used to produce a sintered body having a lower average pore size.

It may be desirable to form agglomerates of the powder as a means of controlling the porosity of the green body formed from the powder. For example, aluminum hydroxide ($Al(OH)_3$) or aluminum sulfate ($Al_2(SO_4)_3$) particles having a diameter of about 50 micrometers can be calcined to form alumina agglomerates that have a porosity of about 50 volume percent. If these agglomerates are then formed into a body with about 50 volume percent packing, the net result will be about 75 volume percent porosity. The agglomerates can also be formed with additional powder to produce green bodies with a wider range of porosity than can be obtained with milled powder alone.

After ceramic powder having a desired particle size range has been obtained, the powder can be formed into a green body. As used herein, the term green body refers to an unsintered body of ceramic powder. For example, the powder can be uniaxially pressed into a green body at a pressure of from about 48 MPa to about 69 MPa (7 ksi to 10 ksi) or isostatically pressed at similar pressures. In addition, forming additives can be used to improve the mechanical strength of the green body formed by pressing the ceramic powder. Additives can include binders such as polyvinyl alcohol, plasticizers such as polyethylene glycol, and lubricants such as aluminum stearate. In addition, other forming methods such as injection molding, extrusion, slip casting and similar processes can be used to form green bodies according to the present invention.

Further, some green bodies with high levels of forming additives may have sufficient strength to enable the green body to be machined. Thus, intricate parts may advantageously be formed by machining processes while the piece is in the soft green state.

One method for controlling the total porosity of the sintered ceramic matrix formed by vapor phase sintering is to control the total porosity of the green body. This can be done, for example, by varying the pressing pressure. Typically, green bodies formed by uniaxially pressing finely-divided ceramic powder have porosities ranging from about 50 volume percent to about 65 volume percent. The total porosity can be increased to from about 70 volume percent to about 80 volume percent by using agglomerated powder, as is discussed hereinabove.

After forming, the green body can be sintered to obtain a sintered ceramic body. If organic binders or other organic materials are used in the green body forming process, these additives can advantageously be removed prior to fully sintering the ceramic powder. This is commonly referred to as "binder burnout." For example, the green body can be placed in a furnace and slowly heated to a temperature of, for example, about 600° C. to volatilize organic additives. Since these organic additives comprise a large amount of carbon, it is usually preferable to volatilize these materials under a flowing gas such as oxygen.

The green body can be presintered prior to vapor phase sintering. Presintering is a convenient and economical method of controlling the total porosity of the final sintered body. Presintering conveniently lowers the porosity of the green body to a range that is desirable for the sintered body, since the vapor phase sintering technique does not substantially affect the total porosity of the sintered body.

Preferably, the presintering step is done at a temperature that is slightly below the normal solid-state sintering temperature of the ceramic material. For example, alumina can be presintered at a temperature of from about 1300° C. to about 1600° C., more preferably from about 1450° C. to about 1550° C. The optimum temperature and sintering time will depend on the particle size of the starting powder or agglomerates. The sintering atmosphere is not critical and, therefore, air is preferred. However, certain atmospheres may be undesirable due to reactions between the atmosphere and the ceramic material at the presintering temperature. The presintering step preferably produces a presintered body having a total porosity of from about 10 percent to about 70 percent. The total porosity can be controlled by varying the time at the presintering temperature, such as from about 1 minute to about 300 minutes. The presintering step can determine the total porosity of the final sintered body, however, presintering may not be necessary if the green body has the desired total porosity for the final sintered product. The presintered body may advantageously be machined to its appropriate final shape and dimensions.

The presintered or green ceramic body is then vapor phase sintered to maintain control over the total porosity and average pore size of the sintered body and form a porous sintered ceramic.

Enhanced vapor phase sintering has been studied for some ceramic materials. According to this process, volatile transport gases at a high partial pressure are produced during sintering. Preferably, the partial pressure of the transport gas is at least about $10^{-4}$ atm at the sintering temperature and more preferably at least about $10^{-3}$ atm. It has been found that for some ceramic materials, the vapor phase sintering process may be enhanced by the presence of a reaction gas or a material that produces such a gas, particularly a gas comprising a halide, in the sintering atmosphere. For example, vapor phase sintering of magnesia can be enhanced by the addition of hydrogen chloride (HCl) gas:

$$MgO_{(s)} + 2HCl_{(g)} \rightleftharpoons MgCl_{2(g)} + H_2O_{(g)} \qquad (1)$$

In one embodiment of the present invention, an alumina-containing body is sintered in the presence of hydrogen chloride gas (HCl), thereby promoting the reaction:

$$Al_2O_{3(s)} + 6HCl_{(g)} \rightleftharpoons 2AlCl_{3(g)} + 3H_2O_{(g)} \qquad (2)$$

Alternatively, alumina may be sintered in the presence of hydrogen fluoride gas (HF) in which case the vapor phase transport occurs primarily via the process:

$$Al_2O_{3(s)} + 6HF_{(g)} \rightleftharpoons 2AlF_{3(g)} + 3H_2O_{(g)} \qquad (3)$$

The reaction gas (e.g., HCl or HF) can be added to the sintering furnace directly in the form of commercially available bottled gas. In this embodiment, the gas should be dry and contain minimal residual moisture. Residual water ($H_2O$) can drive the reverse reaction and inhibit formation of the vapor transport species. Preferably, the partial pressure of the reaction gas is at least about 0.25 atm and is more preferably from about 0.4 atm to about 1 atm.

Alternatively, the gas may be formed in-situ within the sintering furnace. For example, aluminum fluoride ($AlF_3$) powder can be placed in a closed furnace. As the furnace is heated, hydrogen gas is added to the furnace to promote an in-situ reaction to form hydrogen fluoride gas over the alumina. This procedure is particularly advantageous when environmentally difficult gases such as hydrogen fluoride are used.

Sintering temperatures can vary depending on the ceramic material being sintered. For example, alumina powder is preferably sintered at a temperature from about 1400° C. to about 1600° C. to form a sintered ceramic body. The pore size and pore size distribution can be controlled by adjusting the amount of time that the body is sintered at the sintering temperatures. Table 1 lists the mean pore diameter for alumina compacts sintered at 1600° C. for varying amounts of time under 1 atm HCl. For each sample, the starting particle size was 1 micrometer and the porosity of the sample remained at about 50 volume percent regardless of the sintering time.

TABLE 1

| TIME | MEAN PORE SIZE |
|---|---|
| 10 min. | 2.1 microns |
| 80 min. | 3 microns |
| 250 min. | 4 microns |
| 1080 min. | 7.5 microns |

As Table 1 illustrates, as the sintering time increases, the average pore diameter also increases. However, the total porosity remains substantially constant.

The ceramic body may be sintered in any system in which the partial pressure of the reaction gas, and hence the transporting gas can be controlled. For example, a simple tube furnace having a sealed end with an inlet for the reaction gas may be used.

As an alternative to vapor phase sintering, it is known to those skilled in the art that the open porosity of a ceramic can be controlled by controlling variables such as the starting particle size of the ceramic powder, the composition of the ceramic powder and/or the sintering temperature. Specifically, ceramic powder have a larger average particle size, the absence of sintering aids in the composition, and lower sintering temperatures can all produce a sintered ceramic body having open porosity.

For example, porous sintered alumina can be formed from alumina particles having an average particle size in the range of from about 0.5 micrometers to about 70 micrometers by forming the particles into a green body and sintering. The green body can be sintered at a temperature of from about 900° C. to about 1800° C. to form a porous sintered ceramic if the sintering temperature is somewhat below the normal sintering temperature for obtaining dense alumina. The absence of sintering aids, such as silica, will also increase the porosity of the ceramic.

Other methods for forming porous ceramics include the use of pore formers. Pore formers are materials which have a volatilization temperature that is lower than the sintering temperature of the ceramic. Thus, materials such as walnut shells or latex spheres can be added to the ceramic mix. Upon sintering, the material volatilizes, leaving behind open pore space. For example, aluminum titanate porous bodies can be produced by using pore formers, particularly walnut shells.

As discussed above, it is preferable to obtain a ceramic matrix having an open porosity that is at least about 5 volume percent, preferably from about 10 volume percent to about 90 volume percent, and more preferably from about 15 volume percent to about 80 volume percent open porosity. The open porosity preferably has an average pore size of at least about 1 micrometer and more preferably from about 1 micrometer to about 10 micrometers.

When a porous ceramic matrix having the desired total porosity and pore size is obtained, molten metal can be infiltrated into the open porosity of the ceramic matrix. In a preferred embodiment of the present invention, the ceramic matrix is brought into contact with the molten metal and the metal infiltrates the ceramic matrix by capillary action without the assistance of substantial overpressure. Thus, when contacted with the sintered ceramic, the molten metal enters the pore structure of the ceramic and fills substantially all of the open porosity or a selected portion of the open porosity.

According to a preferred embodiment of the present invention, a portion of the sintered ceramic body is contacted with the top surface of a molten pool of infiltrant metal for a time sufficient to infiltrate at least a portion of the sintered ceramic body. According to this embodiment, the infiltrant metal is placed in a refractory vessel and is heated to a temperature in excess of the melting temperature of the metal such that the metal is in the form of a molten pool having a top surface. Preferably, the metal is heated to a temperature that is sufficiently high to melt all constituents of the alloy and is high enough to yield a liquid metal with a low enough viscosity to permit infiltration in the absence of substantial overpressure. For example, if oxygen is used as an infiltration additive, the temperature of the molten metal should be above the melting point of copper oxide, e.g., at least about 1230° C.

The sintered ceramic body is brought into contact with the molten metal and the molten metal infiltrates the open porosity of the ceramic and substantially fills the open porosity. The metal-infiltrated ceramic is then cooled to form the ceramic-metal composite having substantially continuous metal and ceramic phases. It is also possible to heat the composite in a reducing atmosphere to reduce any excess copper oxide to copper metal.

The pool of molten metal infiltrates the ceramic by capillary action which overcomes the forces of gravity and pulls the molten metal into the ceramic matrix. The advantage of using such a process is that the molten metal infiltrates the ceramic structure and no excess metal will flow out of the ceramic structure. Further, since capillary action is the driving mechanism for infiltrating the metal into the ceramic structure, the metal will infiltrate substantially all portions of the ceramic structure, regardless of the shape of the structure, without having to completely immerse the matrix into the molten metal. Further, the infiltrating metal can force out gas as the metal infiltrates so that little or no gas is trapped in the composite.

Figures 2A, 2B, 3A, 3B:
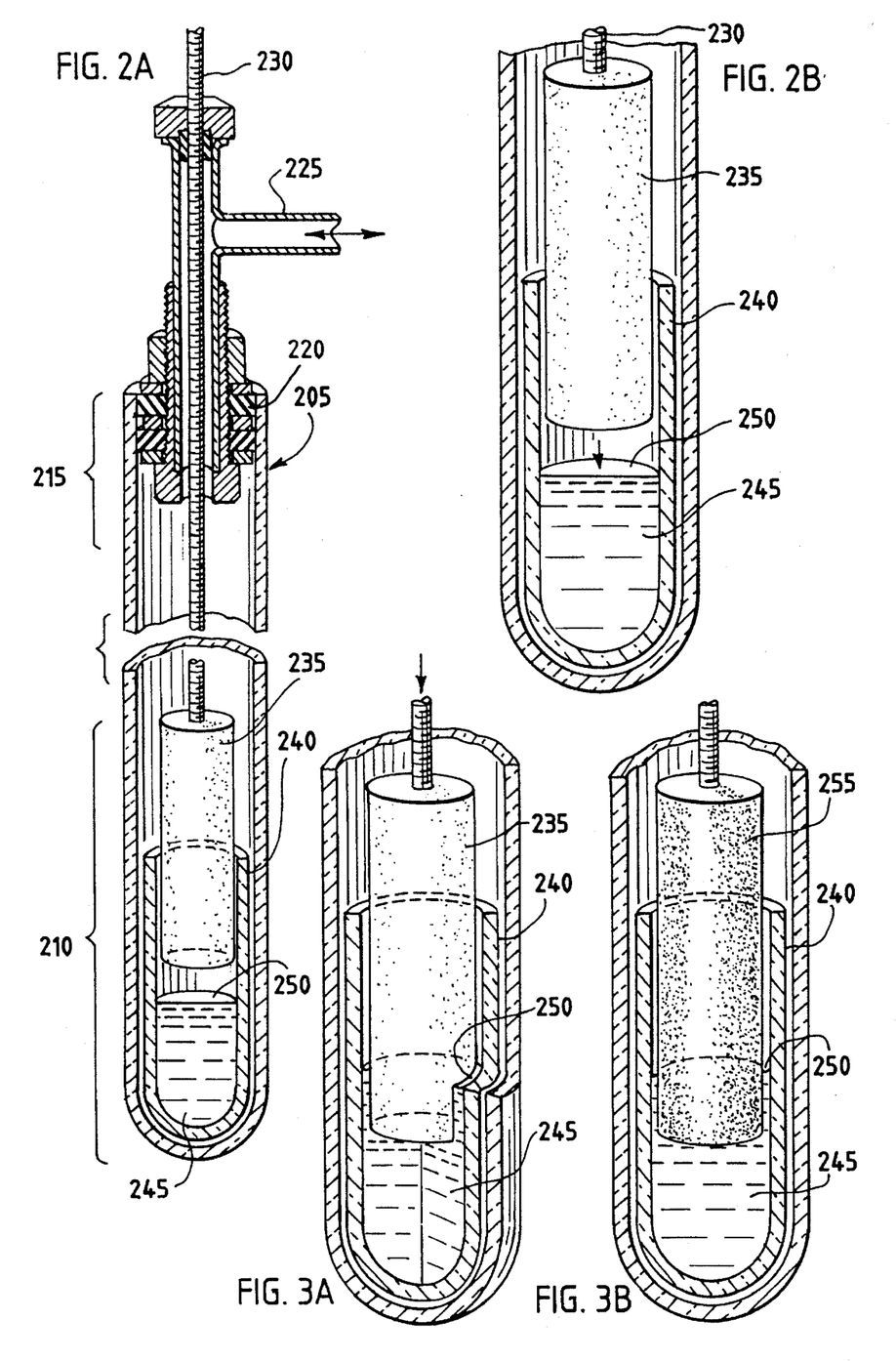
FIG. 2 illustrates an apparatus useful for carrying out a method according to one embodiment of the present invention.
FIG. 3 illustrates an apparatus useful for carrying out a method according to one embodiment of the present invention.

An embodiment of this method is illustrated in FIGS. 2 and 3. Referring to FIG. 2, a ceramic tube 205 is provided having a lower end 210 that is closed and an upper end 215 that is open. The open upper end 215 is sealed, such as by using a teflon seal 220. A gas inlet/outlet 225 is provided such that gases can be extracted from or purged into the ceramic tube 205.

A ceramic control rod 230 extends through the seal 220 and is attached to a sintered ceramic body 235 having open and continuous porosity. The control rod 230 can be raised or lowered to control the vertical position of the sintered ceramic body 235 within the ceramic tube 205.

The lower end 210 of the ceramic tube 205 contains a refractory vessel 240. The lower end 210 is placed in a "hot zone" wherein heating means (not illustrated) can heat the lower end 210 to elevated temperatures. The refractory vessel 240 contains a quantity of molten metal 245 having an upper surface 250. Thus, the sintered ceramic body 235 can be lowered by the control rod 230 such that at least a portion of the sintered ceramic body 235 contacts the upper surface 250 of the molten metal 245.

Referring to FIG. 3, the hot zone is heated to a temperature of at least the melting temperature of the molten metal 245. Preferably, the sintered ceramic body 235 is in the hot zone for a sufficient amount of time that the sintered ceramic body 235 is heated to at least the melting temperature of the molten metal 245. A portion of the sintered ceramic body 235 is contacted with the top surface 250 of the molten metal 245. The molten metal 245 then infiltrates the entire sintered ceramic body 235 to form a ceramic-metal composite 255. Preferably, the amount of molten metal 245 available in the refractory vessel 240 to infiltrate the sintered ceramic body 235 is sufficient in quantity such that the sintered ceramic body 235 completely infiltrates without the top surface 250 lowering to a point below the portion of the sintered ceramic body 235 that is in contact with the molten metal 245.

The method according to this embodiment of the present invention also permits the composite to be formed in a very quick and efficient manner. For example, the infiltration time typically takes less than about 1 hour, preferably less than about 15 minutes and more preferably less than about 1 minute. For example, a 0.75 inch diameter cylinder of porous alumina can be infiltrated to a depth of 3 inches by copper metal in less than about 1 minute.

It is also preferable to heat the ceramic to at least about the temperature of the molten metal. This is desirable since, if the ceramic is substantially cooler, the metal may cool and solidify upon infiltrating and contacting the ceramic matrix and thereby prevent further infiltration of the ceramic matrix by the metal.

The amount of infiltration into the ceramic matrix can be controlled by controlling the amount of time that the matrix is in contact with the molten metal. The desired amount of time will depend upon the ceramic matrix and metal being infiltrated, and the specific amount of time to infiltrate to a specific degree can be determined by routine experimentation.

Although the present invention is applicable to many combinations of matrix and infiltrant metals, it has been found particularly applicable to certain ceramic-metal composites. For example, in one preferred embodiment, copper is the infiltrant metal. As used herein, the term "copper metal" refers to any metal alloy that is predominantly copper, i.e., at least about 50 percent copper. Copper can be alloyed with a number of other elements, and in certain preferred embodiments discussed in detail below, copper can be alloyed with oxygen or titanium.

According to one preferred embodiment, the copper is infiltrated into a ceramic body that comprises a sintered ceramic oxide selected from the group of alumina, aluminum titanate, magnesium oxide and nickel oxide. In a more preferred embodiment, the ceramic matrix is alumina. Copper infiltrated alumina can advantageously provide good hardness and strength provided by the ceramic matrix. Such combinations are useful for producing certain engine components, such as valve seats.

To improve the capillary action between the ceramic and the molten metal, it may be desirable to modify the wetting or spreading characteristics of the ceramic and metal. One way to do this is to coat the open porosity of the ceramic with a coating that is more easily wet by the molten metal. For instance, the interior surfaces of a sintered alumina ceramic can be modified by vapor phase coating, such as by chemical vapor deposition (CVD), the ceramic with copper oxide or nickel oxide to enhance the infiltration of copper metal.

Another way of enhancing the wetting characteristics is to modify the chemical composition of the molten metal with an infiltration additive. For instance, the wetting of molten copper on alumina can be enhanced by the addition of oxygen to the copper or with the addition of titanium (Ti). Such additions enhance the wetting and permit infiltration to occur rapidly and easily. When oxygen is added, it is preferred to add the oxygen to the copper metal in an amount of from about 1.5 weight percent to about 10 weight percent, more preferably from about 2 weight percent to about 5 weight percent. When titanium is used as an infiltration additive, it is preferably added in an amount of from about 1 weight percent to about 10 weight percent.

After one or more of the surface modifications and chemical alterations noted above, if necessary, the molten metal will wet the ceramic and infiltrate substantially all of the void space of the ceramic through capillary action.

In a preferred embodiment, the metal infiltration step is performed in a vacuum atmosphere. As used herein, vacuum atmosphere refers to an atmospheric pressure of about 10 millitorr or less. The evacuation of air from the ceramic void space reduces the likelihood that air pockets will be entrapped in the composite.

Figure 1:
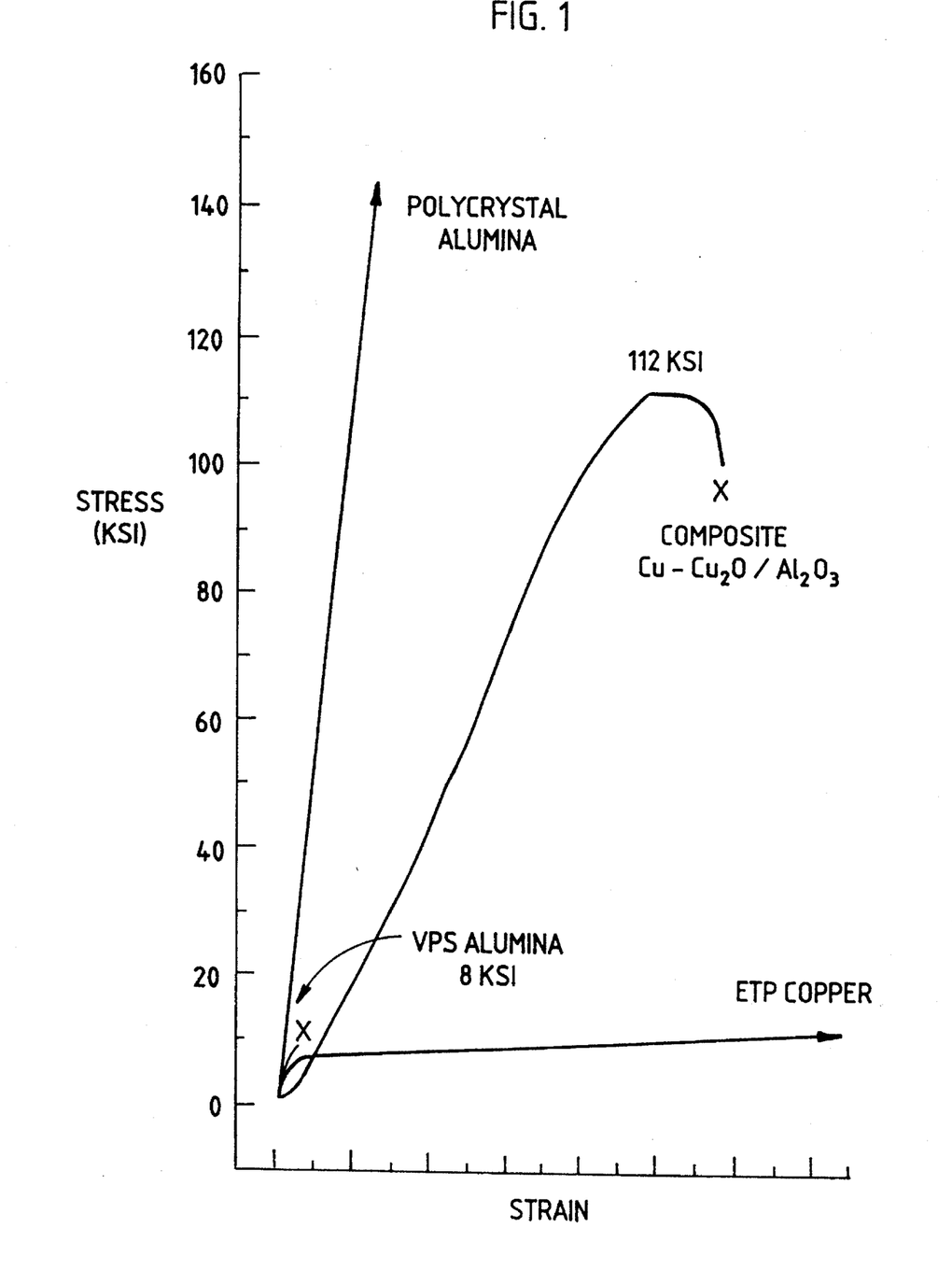
FIG. 1 is a compression stress-strain diagram comparing a composite produced according to the present invention with the component materials of the composite.

The ceramic-metal composites produced by the present invention have relatively high strengths and toughness. In one embodiment, a composite comprising about 65 percent alumina and about 35 percent copper/copper oxide has a compressive strength of at least about 110 ksi, as illustrated in FIG. 1.

According to one preferred embodiment of the present invention, the sintered ceramic matrix material has a porosity gradient. That is, the porous ceramic matrix has regions of different porosity. For example, one portion of the ceramic matrix can be substantially 100 percent dense while another portion can have a high porosity, for example about 60 percent or greater. When the porous end is contacted with molten metal, the metal will infiltrate throughout the open porosity, resulting in an article having a dense ceramic portion and a composite portion. The porosity gradient may be gradual through the material or it may include one or more abrupt changes in porosity, such as a ceramic matrix formed by layers of material having different porosity characteristics. The advantages of a gradient composite material can include the alleviation of the effects of an abrupt thermal expansion gradient, the ability to attach the composite to a variety of materials and the ability to have an article with a dense ceramic surface intimately attached to a composite surface. This embodiment of the invention is described in more detail in co-pending U.S. patent application Ser. No. 08/220,559.

The use of a porosity gradient is particularly advantageous for fabricating certain engine components. For example, a valve for an internal combustion engine can be fabricated wherein the top portion of the valve comprises substantially fully dense ceramic which is connected to a ceramic-metal composite which can be connected to a metal stem.

Figure 4:
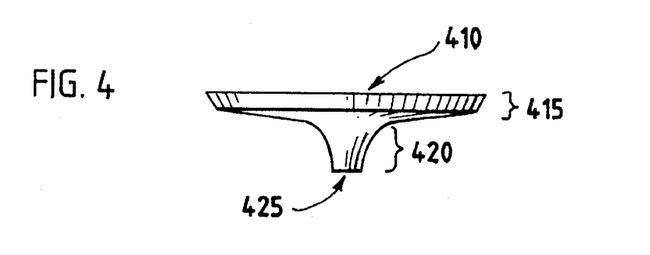
FIG. 4 illustrates a valve head according to one embodiment of the present invention.
Figures 5, 6:
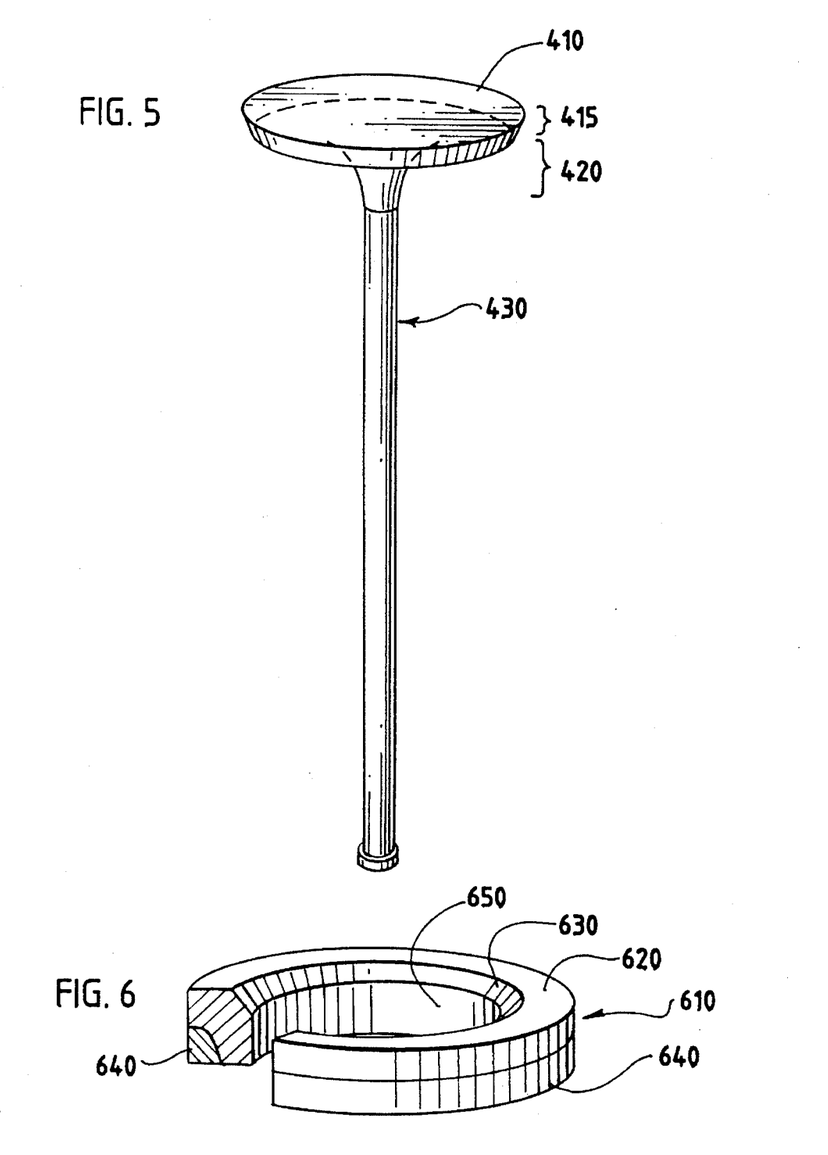
FIG. 5 illustrates a valve according to one embodiment of the present invention.
FIG. 6 illustrates a valve seat according to one embodiment of the present invention.

This embodiment of the present invention is illustrated in FIGS. 4 and 5. Referring to FIG. 4, a ceramic valve head 410 is illustrated. The valve head includes an upper portion 415 having a generally frustoconical shape. The upper portion 415 preferably consists essentially of dense ceramic, such as silicon nitride ceramic or alumina. The valve head further includes a lower base portion integrally connected to the upper portion that has a smaller base diameter than the upper portion and is fabricated from a sintered ceramic having substantially continuous and open porosity. Preferably, the porosity decreases from the lower surface 425 up to the upper portion 415.

The valve head 410 can be infiltrated with a molten metal as described hereinabove. Preferably, the valve head is infiltrated by contacting the lower surface 425 with molten metal for a time sufficient to permit the molten metal to completely infiltrate the open porosity in the lower portion 420 of the valve head. The molten metal can be selected from any metal that will wet and infiltrate the ceramic and may include nickel alloys, such as nickel-titanium, or steel compositions.

The valve head can then be connected to a metal valve stem as illustrated in FIG. 5. Referring to FIG. 5, a valve stem is fabricated from a metal such as a nickel alloy. The valve stem 430 is connected to the lower portion 420 of the valve head 410. The valve stem 430 can be connected to the bottom portion 420 of the valve head 410 by a number of means including butt welding.

Alternatively, a valve can be fabricated such that the entire valve consists essentially of a ceramic-metal composite produced according to the present invention. Also, a valve can be fabricated wherein the outer portion of the valve comprises a ceramic-metal composite and the interior of the valve, such as the interior of the valve stem, consists essentially of a metal.

Other engine components comprising a ceramic-metal composite can be fabricated according to the present invention. For example, FIG. 6 illustrates a valve seat 610. The valve seat includes an upper portion that is adapted to receive a valve face on the seating surface 630. The upper portion includes a ceramic-metal composite, which can be fabricated in accordance with the techniques described hereinabove. The valve seat also includes a lower portion 640 integrally connected to the upper portion 620 wherein the lower portion comprises a metal, preferably the same metal infiltrated into the ceramic-metal composite portion 620. The aperture 650 through the valve seat 610 is adapted to receive the stem of the valve. In a preferred embodiment, the metal portion 640 includes copper metal. In an alternative embodiment, the entire valve seat 610 can be fabricated from a metal-ceramic composite. One of the advantages of using a ceramic-metal composite according to the present invention is that the composite has good wear resistance and the surfaces are still ductile. The ductile surfaces eliminate contact points that are experienced when dense ceramic is used for valve seats.

Another application of the present invention is in the area of engine component liners, such as exhaust port liners for diesel engines. See, for example, the port liners described in U.S. Pat. No. 5,066,626 by Fukao et al., which is incorporated herein by reference in its entirety. Aluminum titanate is a preferred ceramic material due to its resistance to corrosion and its low thermal expansion characteristics. One of the problems associated with these port liners is that a compliant layer between the metal (e.g., aluminum or cast iron) and the aluminum titanate is necessary to absorb stresses resulting from the contracting metal.

It is believed that the problem can be reduced by infiltrating an aluminum titanate material having a porosity gradient. The infiltrated metal gradient will assist in alleviating the stresses caused by the contraction of the metal. For example, copper can be infiltrated into the aluminum titanate porous body by the process described above. A portion of the port liner can include a closed foam (closed porosity) to provide insulation.

In addition, the process of the present invention can be used to fabricate pistons. The process is similar to that described above for the fabrication of a valve. Also, rocker arms would benefit from the use of ceramic-metal composites described herein due to the lighter weight and wear resistance of the ceramic-metal composites.

EXAMPLE 1

An alumina powder (CERALOX HPA, Ceralox Corp., Tucson, Ariz.) is obtained having an average particle size of about 1.0 micrometers. The alumina powder is formed into a green body by uniaxially pressing the powder at a pressure of about 50 MPa to obtain a green body having a porosity of about 55 volume percent.

The green body is then presintered in air at a temperature of about 1500° C. for about 3 minutes. The presintered body has a porosity of about 35 volume percent.

The presintered body is then placed in a sintering furnace that comprises an alumina tube. The temperature of the furnace is raised as the furnace is evacuated. Before reaching about 800° C., the furnace is purged with argon gas to remove impurities in the furnace atmosphere. At about 800° C., the furnace is filled with HCl gas having a pressure of about 1 atm. The alumina body is then sintered under HCl gas at a temperature of about 1600° C. for about 80 minutes.

The sintered alumina ceramic has a total porosity of about 35 volume percent and has an average pore size of about 3 micrometers. The alumina forms a continuous three-dimensional structure and there is substantially no closed porosity.

The sintered alumina ceramic is placed in a furnace and heated to about 1275° C. and is contacted with a molten copper bath containing about 3 weight percent oxygen at a temperature of about 1275° C. The bottom surface of the alumina ceramic is contacted with the molten metal and the molten metal infiltrates through the entire alumina matrix by capillary action. The composite is then cooled. The composite comprises about 65 volume percent of a substantially continuous alumina phase and about 35 volume percent copper/copper oxide as a substantially continuous phase.

The stress strain diagram for the sample is illustrated in FIG. 1. The composite has a compressive strength of about 112 ksi.

EXAMPLE 2

To demonstrate the feasibility of infiltrating copper into aluminum titanate, two disks of a porous aluminum titanate were obtained. The aluminum titanate disks had a porosity of about 20 volume percent and about 70 volume percent. Copper metal was contacted with the aluminum titanate disks and the assemblies were heated to about 1300° C. in air and substantially complete infiltration occurred in about 20 minutes. Copper metal infiltrated the aluminum titanate and contained about 4.5 weight percent oxygen. The composite can be heated in a reducing atmosphere to reduce the residual copper oxide to copper.

EXAMPLE 3

Reaction bonded silicon nitride was infiltrated with 99.5 percent pure aluminum. In this process, aluminum was contacted with a reaction bonded silicon nitride body and the assembly was heated in a vacuum furnace at 1100° C. for 60 minutes. A portion of the silicon nitride was infiltrated with aluminum. There was some fracture of the composite portion from the silicon nitride body due to the thermal expansion mismatch.

EXAMPLE 4

This example illustrates the infiltration of silicon nitride with a nickel-titanium alloy. A nickel-titanium alloy containing 10 weight percent titanium was placed in contact with a porous silicon nitride body and was heated in a vacuum furnace to a temperature of 1400° C. with a partial pressure of oxygen of about $10^{-8}$ atmospheres. The nickel-titanium alloy infiltrated the silicon nitride. Similar results were obtained when chromium was substituted for titanium.

EXAMPLE 5

Alumina was infiltrated with a silver-copper alloy composition including about 95 percent silver and about 5 percent copper/copper oxide. The advantage of this composite is that the silver maintains a high ductility in the composite.

EXAMPLE 6

Aluminum having a purity of 99.5 percent was infiltrated into reaction bonded silicon carbide having silicon metal as a second phase. The system was maintained at 1100° C. for 60 minutes to insure complete mixing in the liquid state. The aluminum infiltrated the silicon carbide.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A valve for an internal combustion engine, comprising:

(a) a valve stem comprising an elongated metallic member; and (b) a valve head integrally connected to an end of said valve stem, said valve head generally having a frusto-conical shape and a valve face on the outer circumferential surface of said valve head, wherein said valve head comprises an upper portion including a valve face and consisting essentially of dense ceramic and a lower portion having a base diameter that is smaller than said upper portion and comprising a metal-infiltrated ceramic.

2. A valve as recited in claim 1, wherein said valve stem comprises a metal selected from the group of nickel alloys and steels.

3. A valve as recited in claim 1, wherein said valve stem is welded to said valve head.

4. A valve as recited in claim 1, wherein said valve head comprises a silicon nitride ceramic having a substantially continuous porosity gradient that has been infiltrated with a metal.

5. A method for making a valve for an internal combustion engine, comprising the steps of:

(a) forming a sintered ceramic body, said sintered ceramic body generally having frustoconical shape with an upper portion and a lower portion wherein the open porosity of said sintered ceramic in said lower portion is greater than the open porosity in said upper portion;

(b) contacting said sintered ceramic body with a molten metal under conditions such that said molten metal infiltrates the open porosity of said sintered ceramic to form a valve head; and (c) connecting said valve head to an end of a metal valve stem to form a valve.

6. A method as recited in claim 5, wherein the top surface of said upper portion of said valve head consists essentially of ceramic.

7. A method as recited in claim 5, wherein the top surface of said top portion consists essentially of ceramic that is substantially fully dense.

8. A method as recited in claim 5, wherein said step of connecting said valve head to said valve stem comprises welding said valve head to said valve stem.

* * * * *